United States Patent [19]
Prevot et al.

[11] Patent Number: 4,868,528
[45] Date of Patent: Sep. 19, 1989

[54] RING-MOUNTED MICROWAVE DEVICE

[75] Inventors: Julien Prevot, Osny; Jean-Pierre Bonnet, Saint Cloud, both of France

[73] Assignee: Thomson Hybrides et Microondes, Paris, France

[21] Appl. No.: 211,046

[22] Filed: Jun. 24, 1988

[30] Foreign Application Priority Data

Jun. 26, 1987 [FR] France .............................. 87 09032

[51] Int. Cl.$^4$ .............................................. H03C 1/54
[52] U.S. Cl. ..................................... 332/163; 332/172
[58] Field of Search .......................... 332/47; 455/326; 307/317 R

[56] References Cited

U.S. PATENT DOCUMENTS 2,922,959 1/1960 Holloway et al. ..................... 332/47
3,184,690 5/1965 Garland ............................. 332/43 B

FOREIGN PATENT DOCUMENTS 947860 1/1949 France .
1049351 12/1953 France ................................. 332/47

OTHER PUBLICATIONS

"Distortion Performance of Single-Balanced Diode Modulators" Authors: J. G. Gardiner, B.Sc., Ph.D., and A. M. Yousif, M.Sc. Proc. IEE, vol. 117, No. 8 Aug. 1970, pp. 1609–1614.

Primary Examiner—David Mis
Attorney, Agent, or Firm—Oblon, Spivak, McClelland, Maier & Neustadt

[57] ABSTRACT

An microwave device of the diode-operated amplitude modulator or switch type is disclosed. The ring is formed by a source of symmetrical currents which powers the diodes connected to a load. When the diodes are off, they show a capacitance which gives a reactive current. To improve isolation or attenuation, the current in the load must be zero. This is obtained by mounting, on diagonals of the ring, two capacitors which give two currents that are equal and opposite to the two reactive currents.

4 Claims, 3 Drawing Sheets

RING-MOUNTED MICROWAVE DEVICE

BACKGROUND OF THE INVENTION

1. Field of the Invention

The present invention relates to a ring-mounted microwave device with two bridge-mounted diodes of the switch or amplitude modulator type with a wide pass band, the performance of which is made independent of the frequency. This aim is achieved by neutralizing the reactive currents of the diodes, due to the capacitances of the diodes when they are off. The reactive currents are neutralized by two capacitors mounted diagonally with respect to the bridge, each of them being connected between the anode of a diode and the cathode of the other diode, the set thus constituting a balanced ring.

2. Description of the Prior Art

Devices such as a diode operated modulator or switch, used in the microwave range from 0.5 to 2 GHz, for example, are well known. An example of a modulator is given in FIG. 1. This modulator comprises, between an input 1 of the circuit and an output 10, a first powering stage, symmetrical with the diodes, which may consist of a micro-coiled transformer consisting of a primary winding 2 and two secondary windings 3 and 4. These two secondary windings supply two diodes 5 and 6, mounted in the same direction, which are themselves connected to two primary windings 7 and 8 of an output transformer, the secondary winding 9 of which powers the output 10. The diodes 5 and 6 are polarized from two midpoints 11 and 12 taken between the windings 3 and 4, on the one hand, and 7 and 8, on the other hand.

Other modulators are known. These known modulators use either a single diode instead of two diodes, or they are made with a three-plate or microstrip technology; This fact in no way alters the problem to which the invention provides a solution.

The problem that arises with known modulators is that, when the diodes are off, they are equivalent to a capacitor which has been represented by a capacitor 13, for the diode 5 and a capacitor 14, for the diode 6, shown in dashes. However, it is noted that the isolation obtained, for a switch, or the attenuation obtained, for a modulator, diminishes when the frequency increases. This phenomenon is shown in FIG. 2 where it is seen that the isolation, expressed in negative decibels, diminishes when the frequency increases, in the GHz range. This phenomenon is obviously due to the capacitance of the diodes in the off state.

The isolation or attenuation obtained with zero current is optimum if the output current of the device is zero, i.e. if the current given out by each diode is zero. Now, the off state of each diode displays a certain capacitance which is subjected to a high frequency electrical voltage: the current of each diode is not zero.

According to the invention, a current in phase opposition is set against the current of the first diode. This current in phase opposition is picked up before the second diode by means of a capacitance of substantially the same value as the capacitance displayed by a diode which is off: the two currents cancel each other out. Since this assembly is symmetrical, the resulting current is also zero.

SUMMARY OF THE INVENTION

More precisely, the invention comprises a ring-mounted microwave device having a symmetrical current source which supplies opposite voltages to the anodes of two diodes which are series-mounted in the circuit, the cathodes of these diodes being connected to a load, said device comprising, in order to neutralize the reactive currents due to the capacitances of the diodes in the off state, ring-mounted means to inject currents that are equal but have opposite signs with respect to said reactive currents, said means being each connected between the anode of the first cathode and the cathode of the second diode.

BRIEF DESCRIPTION OF THE DRAWINGS

The invention will be better understood from a more detailed description of an embodiment based on a modulator built with micro-wiring techniques and made with reference to the appended figures, of which.

DESCRIPTION OF PREFERRED EMBODIMENTS

Figure 1:
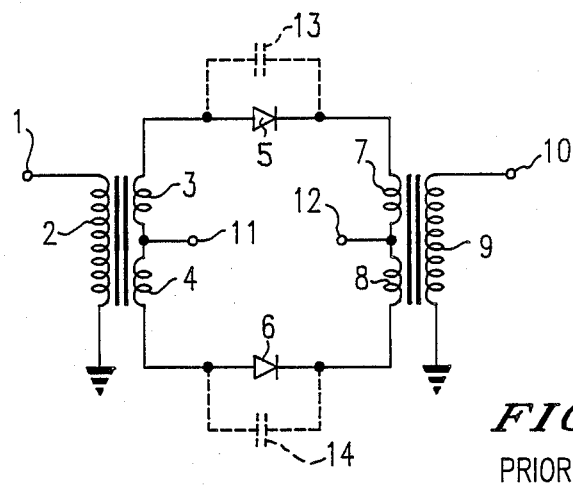
FIG. 1 shows an electrical diagram of a prior art modulator with two diodes, described above.
Figure 2:
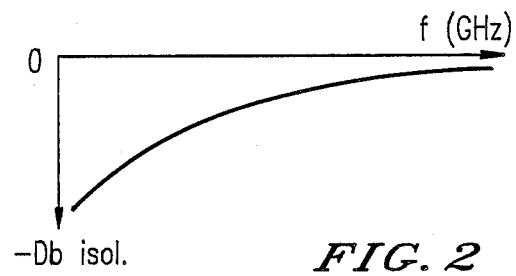
FIG. 2 shows a curve of the variation in isolation of a switch for the attenuation of a modulator according to the prior art, described above.
Figure 3:
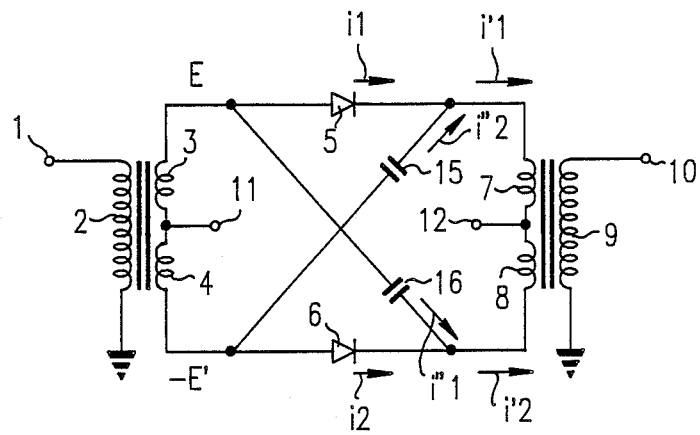
FIG. 3 shows an electrical diagram of a modulator with two diodes according to the invention, in a micro-wired embodiment.

The device according to the invention shown in FIG. 3 also has all the known elements of the prior art device, as shown in FIG. 1. These elements bear the same references in order to make the comparison easier.

According to the invention, in a modulator with two diodes 5 and 6, two capacitors 15 and 16 are added, a first capacitor 15, for example, being connected between a point located at a point which is at the anode of a first diode 6 and the cathode of the second diode 5, while a second capacitor 16 is connected between the anode of a second diode 5 and the cathode of the first diode 6, the set of two diodes and two capacitors thus forming a ring.

When the current flows through the diodes 5 and 6, these diodes can be likened to a resistor, but when these diodes are off, they can be likened to two low-value capacitors which were shown with dashes in 13 and 14 of FIG. 1. There flows, from them, a reactive current $i_1$ for the diode 5 and $i_2$ for the diode 6. For the switch to have perfect isolation or for the modulator to have optimum attenuation, the current $i'_1$ which flows in the coil 7 and the current $i'_2$ which flows in the coil 8 should cancel each other out, and they cancel each other out more surely if they are themselves zero. The purpose of the capacitors 15 and 16 is to add, to the two reactive currents, $i_1$ and $i_2$, currents picked up at the opposite branch of the ring such that:

$i''_2 = i_1$ and $i''_1 = i_2$

Thus $i_1$ and $i''_2$ cancel each other out.

Figure 4:
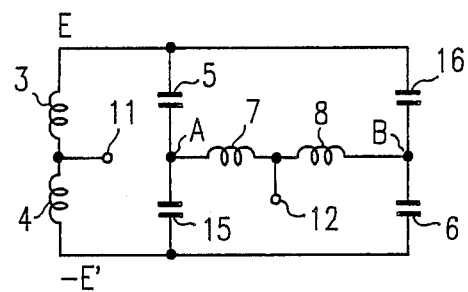
FIG. 4 shows a diagram comparable to the diagram of the preceding figure when the diodes are off.

The ring of the modulator can be shown in an equivalent circuit given in FIG. 4. The diodes 5 and 6 are shown therein in their capacitive equivalent at the off state. In the most simple example, it can be considered that the power voltages E and $-E'$, given by the primary transformer and the coils 3 and 4, are equal and have opposite signs. It may also be considered that the capacitances of the diodes 5 and 6 are equal. If A and B designate the two points of the ring constituting the points common to a diode, a capacitor and an output transformer, then we can write:

if $E = -E'$,
and if $C_5 = C_6$,
then $V_A = V_B = 0$

Whatever the frequency, the output transformer connected between A and B is not crossed by any current, and the isolation is infinite or the attenuation of the modulator is at its optimum.

But in a more general case, $V_A = 0$ if $E'C_{15} = E C_5$ $V_B = 0$ if $E C_{16} = E'C_6$ provided that $E'$ and $E$ are in opposition.

Figure 5:
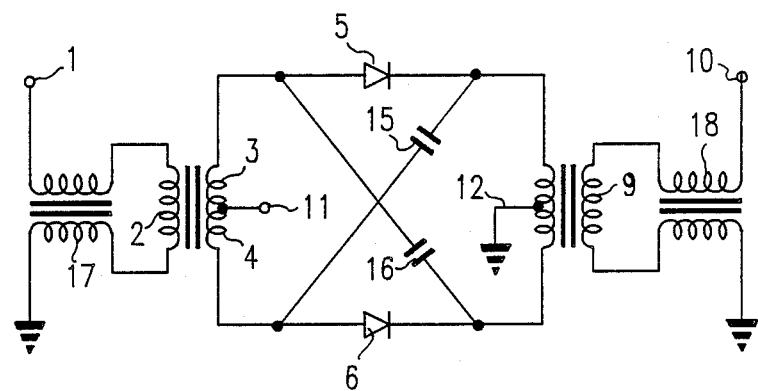
FIG. 5 shows an improvement of the diagram of FIG. 3.
Figure 6:
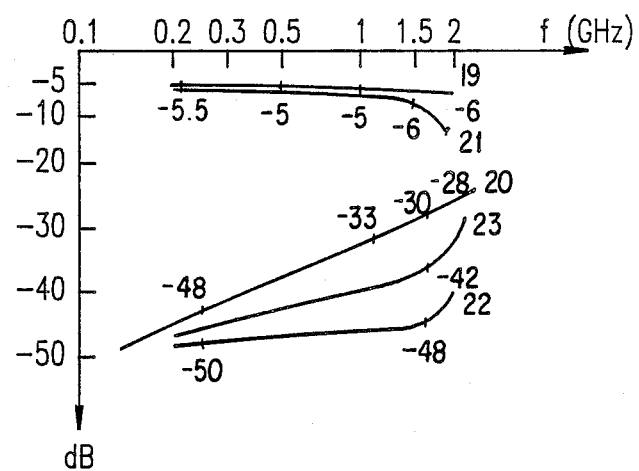
FIG. 6 shows comparative curves of the performance of a modulator according to the prior art and a modulator including the improvement of the invention.

An embodiment of an amplitude modulator, made with wired technology according to the scheme of the invention, is shown in FIG. 5. It can be considered that the modulator has a central part which corresponds exactly to the modulator according to the invention shown in FIG. 3, but it further has a dissymmetrical/symmetrical transformer 17 at its input and a dyssymmetrical/symmetrical transformer 18 at its output so as to provide a better balance between the high frequency voltages at the diodes 5 and 6. The performance values of this modulator have been measured in frequency range from 0.2 to 2 GHz, for a loss characteristic $i = 10$ milliamperes, and an isolation characteristic $i = 0$ and $v = 0$, the capacitances of each of the diodes being 0.27 pF which represents the total junction and package capacitance. The capacitance values of the two fixed capacitors 15 and 16, added together, also have a value very close to 0.27 pF, and the performance characteristics of this modulator according to the invention are shown in FIG. 6, in comparison with the performance characteristics of a prior art modulator under the same conditions. The curves 19 and 20 respectively give the loss variation and the isolation variation for a prior art modulator according to FIG. 1. The curves 21 and 22 respectively give loss and isolation variations for a modulator according to the invention conforming to FIG. 5. It can be seen that the invention is of definite value, at least up to 1.5 GHz. With respect to isolation, the curve 22 which corresponds to a micro-wired circuit such as the one shown in FIG. 5 shows an improvement of 18 dB at 1.5 GHz. At the same frequency, and under the same conditions, the losses increase only by 1 dB.

Figure 7:
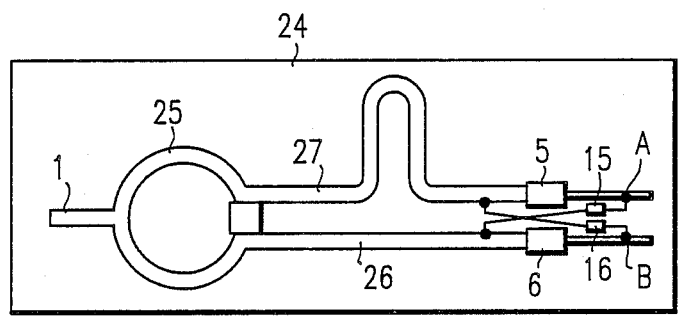
FIG. 7 shows an embodiment of the invention using microstrip technology.

The curve 23 corresponds to the variation in isolation for a modulator according to the invention which, however, is made with microstrip hybrid technology, according to FIG. 7. It can be observed that at 1.5 GHz, the gain in isolation is not more than 12 dB, but this is still a considerable improvement in view of the fact that, for a prior art modulator, the isolation at 1.5 GHz was $-30$ dB only.

FIGS. 1, 3, 4 and 5 correspond to embodiments of the modulator in micro-wired technology, i.e. they comprise, in fact, tiny transformers wound on cores. It is known that, in microwave applications, it is more usual at present to work with integrated technologies such as three-plate technology and metallic microstrips deposited on a substrate. FIG. 7 shows the embodiment of a modulator made with this microstrip technology: on a plate of ceramic material 24, the rear side of which is metallized to give a ground plate, a power divider 25, known as a Wilkinson power divider, is deposited in microstrip form and is used to separate the power applied to the input into two equal parts which are collected by two microstrips 26 and 27. One of the microstrips, for example, the microstrip 27 in the FIG., has a loop which is used to phase shift the currents so that the voltages applied to the two microstrips, at the connection with the diodes 5 and 6, are equal in amplitude but have opposite phases, the loop on the microstrip 27 being computed to give a phase shift equal to $\lambda/2$. The two diodes 5 and 6 can be deposited on the substrate in the form of chips, or they can be fitted on in a package. The capacitors 15 and 16 may be small MOS capacitors or they may also, quite simply, each consist of two wires soldered to an input microstrip and an output microstrip, these two wires being insulated and twisted so as to bring a capacitance, between them, which is substantially equal to the capacitance of the diode used. Just as a Wilkinson power divider divided the current at the input into two equal parts, so a combiner can be used to combine the two currents at the output.

The improvement provided by the invention to the amplitude switches or modulators is essentially used in microwave technology for data processing, either in telecommunications or in pulse radars.

The invention has been described with reference to the example of an amplitude modulator, but it is obvious that all possible alternatives in the different technologies, relating to circuits similar approaching those of switches or modulators, fall within the scope of the invention, which is specified by the following claims.

What is claimed is:

1. A ring-mounted microwave device, comprising:
   a symmetrical current source which outputs a first and second voltage wherein said first voltage is equal to, but opposite in sign from said second voltage;
   a first diode having its anode connected to receive said first voltage and its cathode being connected to a first terminal of a load;
   a second diode connected to receive said second voltage at its anode and wherein the cathode of said second diode is connected to a second terminal of said load;
   ring-mounted means connected between the anode of said first diode and the cathode of said second diode and between the anode of said second diode and the cathode of said first diode, wherein said ring mounted means neutralizes reactive currents due to capacitances of said diodes when diodes are in the off state by injecting currents which are equal, but have opposite signs with respect to said reactive currents.

2. A ring-mounted microwave device according to claim 1, wherein said ring-mounted means consist of two capacitors, with a capacitance value close to the capacitance value shown by a diode in the off-state.

3. A ring-mounted microwave device according to claim 2 comprising an amplitude modulator.

4. A ring-mounted microwave device according to claim 2 comprising a diode-operated switch.

* * * * *